United States Patent [19]

Nagumo et al.

[11] Patent Number: 4,916,043
[45] Date of Patent: Apr. 10, 1990

[54] IMAGE-FORMING METHOD EMPLOYING LIGHT-SENSITIVE MATERIAL COMPRISING THE REMOVAL OF WATER FROM THE BASE PAPER SUPPORT

[75] Inventors: Akihiko Nagumo; Koichi Nakamura, both of Kanagawa, Japan

[73] Assignee: Fuji Photo Film Co., Ltd., Kanagawa, Japan

[21] Appl. No.: 241,791

[22] Filed: Sep. 6, 1988

Related U.S. Application Data

[63] Continuation of Ser. No. 134,112, Dec. 17, 1987, abandoned.

[30] Foreign Application Priority Data

Dec. 17, 1986 [JP] Japan .................. 61-298632
Apr. 20, 1987 [JP] Japan .................. 62-96801

[51] Int. Cl.⁴ .......................... G03C 5/54; G03C 3/00
[52] U.S. Cl. .................................... 430/203; 430/253; 430/254; 430/349; 430/538
[58] Field of Search ............... 430/203, 253, 254, 349, 430/350, 538

[56] References Cited

U.S. PATENT DOCUMENTS 4,550,071 10/1985 Aono et al. .................. 430/203
4,629,676 12/1986 Hayakawa et al. ............ 430/203

FOREIGN PATENT DOCUMENTS 173195 10/1982 Japan .
2163271 2/1986 United Kingdom .

OTHER PUBLICATIONS

Japanese Patent Provisional Publication No. 54 (1979)-30032, Abstract Only.

Primary Examiner—Paul R. Michl
Assistant Examiner—Patrick A. Doody
Attorney, Agent, or Firm—Sughrue, Mion, Zinn, Macpeak & Seas

[57] ABSTRACT

An image-forming method comprises imagewise exposing a light-sensitive material comprising a light-sensitive layer containing silver halide, a reducing agent and a polymerizable compound provided on a paper support; and simultaneously or thereafter heat-developing the light-sensitive material to imagewise polymerize the polymerizable compound. Another image-forming method comprises: imagewise exposing a light-sensitive material comprising a light-sensitive layer containing silver halide and a dye providing substance on a paper support; and simultaneously or thereafter heat-developing the light-sensitive material to imagewise form or release a diffusible dye. The paper support comprises a coating layer containing a hydrophobic polymer provided on a base paper sheet, and the light-sensitive layer is provided on the coating layer. The light-sensitive material is heat-developed after removal of water from the base paper sheet.

16 Claims, 4 Drawing Sheets

IMAGE-FORMING METHOD EMPLOYING LIGHT-SENSITIVE MATERIAL COMPRISING THE REMOVAL OF WATER FROM THE BASE PAPER SUPPORT

This is a continuation of application Ser. No. 07/134,112 filed Dec. 17, 1987, now abandoned.

BACKGROUND OF THE INVENTION

1. Field of the Invention

This invention relates to an image-forming method which employs a light-sensitive material comprising a light-sensitive layer containing silver halide, a reducing agent and a polymerizable compound provided on a paper support. The invention also relates to an image-forming method which employs a light-sensitive material comprising a light-sensitive layer containing silver halide and a dye providing substance provided on a paper support.

2. Description of Prior Art

Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143 describe image forming methods which employ a light-sensitive material comprising a light-sensitive layer containing silver halide, a reducing agent and a polymerizable compound provided on a support. In these image-forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to form a polymer within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

Further, U.S. Pat. No. 4,668,612, European Patent Publication Nos. 076,492A and 079,056A, and Japanese Patent Provisional Publication Nos. 58(1983)-28928, 58(1983)-58543, 58(1983)-79247, 58(1983)-149046, 58(1983)-149047 and 59(1984)-26008 describe other image forming methods which employ a light-sensitive material comprising a light-sensitive layer containing silver halide and a dye providing substance provided on a support. In these image-forming methods, the light-sensitive material is imagewise exposed to light, and simultaneously or thereafter the light-sensitive material is heat-developed to imagewise form or release a diffusible dye by an oxidation-reduction reaction.

As the support for the above-stated light-sensitive materials, a paper is sometimes employed, because a paper is disposable, lightweight and easy to handle.

SUMMARY OF THE INVENTION

According to study of the present inventors, a paper support sometimes shows certain unfavorable behavior in the above-stated image-forming methods. In more detail, in the case that the light-sensitive material is heat-developed, unevenness, distortion or deformation of the obtained image is sometimes observed. It is also observed that the density of the obtained image is not uniform within the area where that of the original image is uniform.

Accordingly, an object of the present invention is to provide an image-forming method which gives an improved uniform and clear image.

There is provided by the present invention an image-forming method comprising: imagewise exposing a light-sensitive material comprising a light-sensitive layer containing silver halide, a reducing agent and a polymerizable compound provided on a paper support; and simultaneously or thereafter heat-developing the light-sensitive material to imagewise polymerize the polymerizable compound, wherein the paper support comprises a coating layer containing a hydrophobic polymer provided on a base paper sheet, the light-sensitive layer is provided on the coating layer, and the light-sensitive material is heat-developed after removal of water from the base paper sheet.

There is also provided by the invention an image-forming method comprising: imagewise exposing a light-sensitive material comprising a light-sensitive layer containing silver halide and a dye providing substance provided on a paper support; and simultaneously or thereafter heat-developing the light-sensitive material to imagewise form or release a diffusible dye, wherein the paper support comprises a coating layer containing a hydrophobic polymer provided on a base paper sheet, the light-sensitive layer is provided on the coating layer, and the light-sensitive material is heat-developed after removal of water from the base paper sheet.

The image-forming method of the invention is characterized in that water is removed from the base paper sheet while the coating layer prevents water from moving from the base paper sheet to the light-sensitive layer, and then the light-sensitive material is heat-developed.

The present inventors have studied on the above-mentioned unfavorable behavior of a paper support and discovered that at least one cause of the behavior is attributed to water contained in the paper support.

When the light-sensitive material is heat-developed, water contained in the paper support is evaporated. The evaporation of water causes a shrinkage of the paper support, which further causes unevenness, distortion or deformation of the obtained image. Further, water (vapor) liberating from the paper support interferes with uniform development in the light-sensitive layer, since water acts as a promoter in the development process, such as an accelerator of polymerization.

In the image-forming method of the present invention, the influence of water contained in the paper support is effectively eliminated from the image formation. In more detail, water is removed from the base paper sheet while the coating layer prevents water from moving from the base paper sheet to the light-sensitive layer, and then the light-sensitive material is heat-developed.

Therefore, the image-forming method of the present invention gives an improved clear and uniform image in which the occurrence of unevenness, distortion or deformation is greatly reduced and the density can be uniform corresponding to the original image.

DETAILED DESCRIPTION OF THE INVENTION

Figure 1:
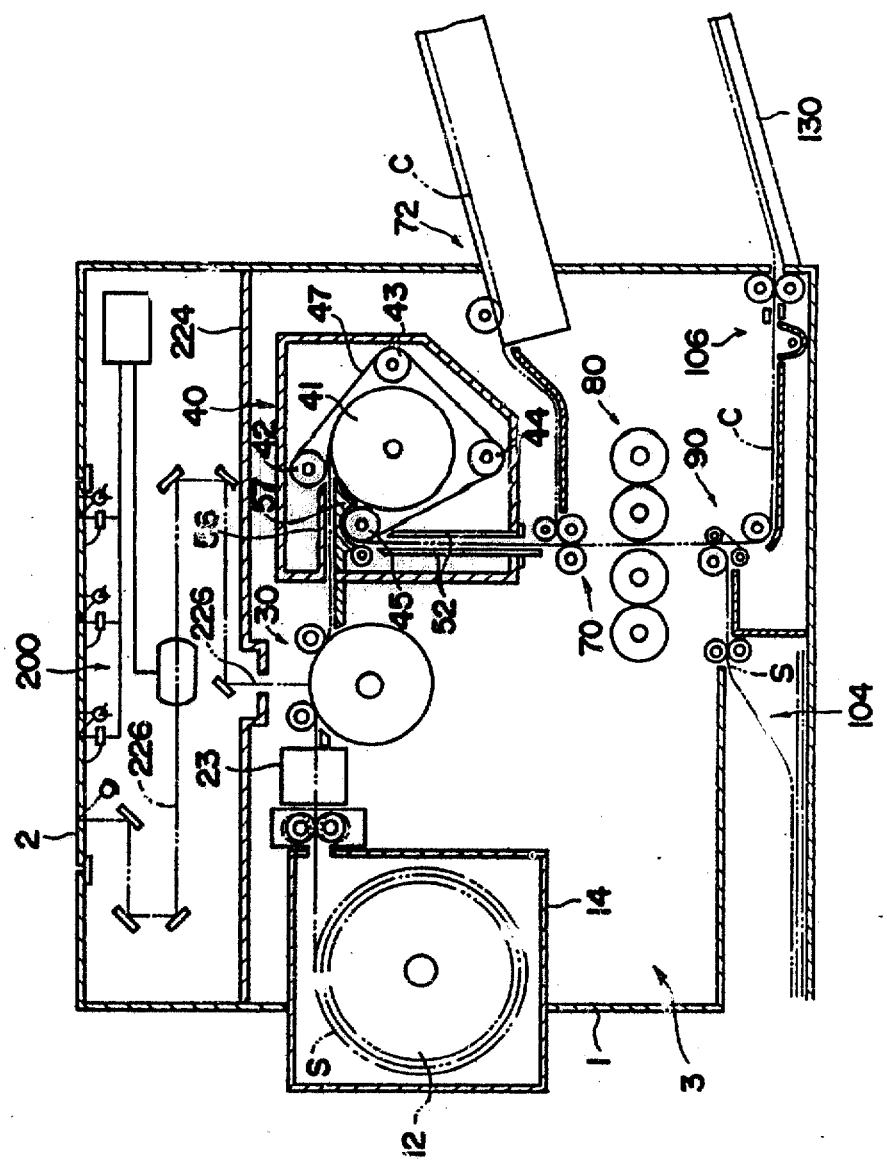
FIG. 1 schematically shows an embodiment of an image recording apparatus suitably employable in carrying out the method of the present invention.

The light-sensitive material employed in the image-forming method of the present invention comprises a base paper sheet, a coating layer containing hydrophobic polymer and a light-sensitive layer in the order. The paper support in the invention comprises the coating layer provided on the base paper sheet.

The constitution of the paper support used in the present invention is described below.

The base paper sheet used for the paper support is mainly composed of wood pulp. As the wood pulp, any of softwood pulp and hardwood pulp can be used. However, hardwood pulp is preferred, because it is mainly composed of short fibers, which are convenient for increasing the smoothness of the paper.

The wood pulp can be partially replaced with a synthetic pulp composed of polyethylene, polypropylene or the like, or a synthetic fiber composed of a polyester, polyvinyl alcohol, nylon or the like.

An internal size such as rosin, paraffin wax, a salt of a higher fatty acid, a salt of an alkenylsuccinic acid, a fatty acid anhydride or an alkylketene dimer is preferably added to the base paper sheet.

A paper strengthening agent (e.g., polyacrylamide, starch, polyvinyl alcohol, melamine-formaldehyde condensate), a softening agent (e.g., a reaction product of a maleic anhydride copolymer with a polyalkylene polyamine, a quarternary ammonium salt of a higher fatty acid), a filler (e.g., calcium carbonate, talc, clay, kaolin, titanium dioxide, fine particles of urea resin), a fixing agent (e.g., aluminium sulfate, polyamide-polyamine-epichlorohydrin), a colored dye and/or a fluorescent dye can be added to the base paper sheet in addition to the internal size.

A conventional surface size can be coated on the surface of the base paper sheet prior to providing a coating layer containing a hydrophotic polymer on the base paper sheet. Examples of the surface size include polyvinyl alcohol, starch, polyacrylamide, gelatin, casein, styrene-maleic anhydride copolymer, alkylketene dimer, polyurethane, an epoxidized fatty acid amide.

The hydrophobic polymer contained in the coating layer preferably is a polymer having a glass transition point in the range of $-20°$ to $50°$ C. The polymer can be a homopolymer or a copolymer. The copolymer may partially contain a hydrophilic repeating unit, so long as it is hydrophobic as a whole. Examples of the hydrophobic polymers include styrene-butadiene copolymer, methyl methacrylate-butadiene copolymer, acrylonitrile-butadiene copolymer, styrene-acrylate copolymer, methyl methacrylate-acrylate copolymer and styrene-methacrylate-acrylate copolymer.

The hydrophobic polymer preferably has a cross-linked structure. The cross-linked structure can be introduced into the hydrophobic polymer when a conventional hardening agent (crosslinking agent) is used together with the hydrophobic polymer in the course of the preparation of the paper support. Examples of the hardening agents include an active vinyl compound (e.g., 1,3-bis(vinylsulfonyl)-2propanol, methylenebismaleimide), an active halogen compound (e.g., sodium salt of 2,4-dichloro-6-hydroxy-s-triazine, 2,4-dichloro-6-hydroxy-s-triazine, N,N'-bis(2-chloroethylcarbamyl)-piperazine), an epoxy compound (e.g., bis(2,3-epoxypropyl)methylpropylammonium p-toluenesulfonate), and a methanesulfonate compound (e.g., 1,2-di(methane-sulfonoxy)ethane). The hardening agent is preferably used in an amount of 0.1 to 10 weight % based on the amount of hydrophobic polmer, and more preferably used in an amount of 0.5 to 5 weight %.

A pigment can be added to the coating layer containing the hydrophobic polymer to improve the smoothness of the surface of the coating layer and to facilitate the formation of the coating layer in the course of the preparation. The pigment may be any of pigments employed in a conventional coated paper (coat paper, art paper, baryta paper etc.). Examples of the inorganic pigments include titanium dioxide, barium sulfate, talc, clay, kaolin, calcined kaolin, aluminum hydroxide, amorphous silica and crystalline silica. Examples of the organic pigments include polystyrene resin, acrylic resin, ureaformaldehyde resin. If a large amount of the inorganic pigment is used, the function of the coating layer may be reduced. Therefore, the inorganic pigment is preferably used in an amount of not more than 300 weight % based on the amount of the hydrophobic polymer, and more preferably used in amount of not more than 200 weight %.

A waterproofing agent can be added to the coating layer containing a hydrophobic polymer. Examples of the waterproofing agent include polyamidepolyamine-epichlorohydrin resin, melamine-formaldehyde resin, urea-formaldehyde resin, polyamide-polyurea resin, glyoxal resin, etc. Among them, resins containing no formaldehyde (e.g., polyamide-polyamine-epichlorohydrin resin and polyamidepolyurea resin) are particularly preferred. The waterproofing agent is preferably used in an amount of 0.1 to 10 weight % based on the amount of the hydrophobic polymer, more preferably in an amount of 0.5 to 5 weight %.

The coating layer can be prepared by coating a latex of the hydrophobic polymer on the surface of the base paper sheet. The other components such as the hardening agent, pigment, waterproofing agent can be previously dissolved or dispersed in the latex of the hydrophobic polymer. The latex can be coated on the base paper sheet according to any of conventional coating methods such as dip coating method, air-knife coating method, curtain coating method, roller coating method, doctor coating method, gravure coating method, etc.

The coating layer containing the hydrophobic polymer is preferably provided on the base paper sheet in a coating weight of 1 to 50 g/m$^2$, more preferably 1 to 30 g/m$^2$, and most preferably 5 to 20 g/m$^2$.

The paper support can be passed through a calender such as gloss calender or supercalender to improve the smoothness of the paper support simultaneously with or after coating the layer containing the hydrophobic polymer on the base paper sheet.

The surface of the coating layer preferably has a low water absorptiveness of not more than 10 g/m$^2$ according to Cobb test method. When the water absorptiveness of the paper support is low, the penetration of the components as well as water into the support can be greatly reduced in the course of the preparation of the light-sensitive material. As a result, the light-sensitive material gives an improved clear image in which the occurence of low density spots in the image formation is greatly minimized or reduced (as is described in co-pending Japanese Patent Application No. 61(1986)-183050).

The water absorptiveness according to Cobb test method (hereinafter referred to as Cobb's water absorptiveness) more preferably is not more than 3 g/m$^2$, and most preferably is not more than 1 g/m$^2$. There is no specific lower limit with respect to the Cobb's water absorptiveness, and the degree can be as low as possible. However, about 0.1 g/m$^2$ is the technically lower limit under the present technical conditions in the preparation of the paper support.

The Cobb's water absorptiveness is measured according to the following manner. Distilled water is brought into contact with the circular area (100 cm$^2$) at the central part of a test piece (130×130 mm) for 120 seconds, and the increase in weight of the test piece is measured. The product of the increased weight (g) multiplied by 100 is defined as Cobb's water absorptiveness. Testing method and apparatus for water absorptiveness of paper (Cobb test) is described in more detail in Specification of Japanese Industrial Standard (JIS-P-8140, 1964), which is similar to TAPPI T-441 OS-69).

Further, the Cobb's water absorptiveness of the base paper sheet itself is preferably reduced to not more than 25 g/m$^2$ by using an internal size or a surface size prior to providing a coating layer containing a hydrophobic polymer. The Cobb's water absorptiveness of the base paper sheet is more preferably not more than 20 g/m$^2$. In order to reduce the Cobb's water absorptiveness of the base paper sheet to not more than 25 g/m$^2$, the internal size and/or the surface size is preferably used in an amount of 1.0 to 3.0 weight % based on the amount of wood pulp.

In the light-sensitive material employed in the image-forming method of the present invention, a light-sensitive layer is provided on the above-mentioned paper support. In an embodiment, the light-sensitive layer contains at least silver halide, a reducing agent and a polymerizable compound. In another embodiment, the light-sensitive layer contains at least silver halide and a dye providing substance. Each of the components will be described later in more detail.

In the image-forming method of the invention, the light-sensitive material is heat-developed after removal of water from the base paper sheet. In the present specification, the removal of water means that water is removed from the base paper sheet to the extent that remaining water does not substantially affect the image formation. In more detail, water is preferably removed from the base paper sheet to the extent that the water content of the base paper sheet is not more than 5%, more preferably not more than 3%, and most preferably not more than 1%. Ordinarily, the water content of a paper support of a light-sensitive material has been about 8%.

In the image forming method, water is preferably removed from the base paper sheet after imagewise exposing the light-sensitive material. In other words, the image-forming method preferably comprises: imagewise exposing a light-sensitive material; removing water from the base paper sheet; and heat-developing the light-sensitive material. The image-forming method of the invention is described in more detail below.

Various exposure means can be employed in the imagewise exposure, and in general, the latent image of the silver halide is obtained by imagewise exposure to radiation including visible light. The type of light source and exposure can be selected depending on the light-sensitive wavelengths defined by spectral sensitization or sensitivity of silver halide. Original image can be either monochromatic image or color image.

In the image-forming method of the present invention, various means can be employed for removing water from the base paper sheet of the paper support, and there is no specific limitation with respect to means for removing water.

For example, the light-sensitive material can be placed in a closed vessel under a circumstance of low humidity to remove water from the base paper sheet. The humidity preferably is not more than 30%, more preferably not more than 20%, and most preferably not more than 15%.

Otherwise, the light-sensitive material can be heated to remove water from the base paper sheet. The heating time and temperature are determined in consideration of the extent that remaining water does not substantially affect the image formation. In more detail, they are determined according to the heating means, the nature of base paper sheet, the shape (roll or sheet) of the light-sensitive material. When the image-forming method is continuously operated in an image-forming apparatus, the light-sensitive material is preferably heated to remove water because it is easy to heat the material in the apparatus, compared with placed the material in a closed vessel.

The heating temperature of removal of water preferably is at least 10° C. lower than that of a heat-development. The heating temperature more preferably is as low as possible. When the heating temperature is low, the removal of water has no influence on the development process and does not affect the image-formation. Further, the low heating temperature has another advantage of avoiding rapid evaporation of water which causes a shrinkage of paper support.

The light-sensitive material is preferably heated from the side of the base paper sheet to remove water. Further, the the material is preferably heated under a condition that the side of the base paper sheet is left open to the air.

Various known means can be employed for heating the light-sensitive material to remove water from the base paper sheet. For example, the light-sensitive material can be dried (heated) by blowing a heated air against the material. The light-sensitive material can be passed through a heated air or a heat roller. The material can be directly contacted with a hot plate or drum to heat the material. Further, a high frequency, a laser beam and an eddy currednt caused by electromagnetic induction can be employed as the heating means. These heating means can be used singly or in combination of two or more means. Among these heating means, it is preferred to pass the material through a heated air or a heat roller, or to directly contact the material with a hot plate or drum, because the means are easy to continuously operate in an image-forming apparatus.

As a result, water is removed (evaporated) from the base paper sheet. In the image-forming method of the invention, water is removed while the coating layer prevents water from moving from the base paper sheet to the light-sensitive layer, so that the influence of water contained in the paper support is eliminated from the image formation.

In the image-forming method of the invention, the light-sensitive marterial is heat-developed after removal of water from the base paper sheet.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

In the first embodiment, the light-sensitive layer contains at least silver halide, a reducing agent and a polymerizable compound. During the heat-development process, the polymerizable compound is polymerized within the area where a latent image of the silver halide has been formed or within the area where a latent image of the silver halide has not been formed. In a general system, the polymerizable compound within the area where the latent image has been formed is polymerized. If a nature or amount of the reducing agent is controlled, the polymerizable compound within the area where the latent image has not been formed can be polymerized.

In the development process of the first embodiment, a polymer image can be formed on the light-sensitive layer. A pigment image can be also obtained by fixing pigments to the polymer image. Further, a color image can be formed on the light-sensitive material in which the light-sensitive layer contains a color former and a developer, one of them is together with the polymerizable compound contained in a microcapsule, and the other is arranged outside of the microcapsule.

In the second embodiment, the light-sensitive layer contains at least silver halide and a dye providing substance. During the heat-development process, a diffusible dye is formed or released from the dye providing substance by an oxidation-reduction reaction within the area where a latent image of the silver halide has been formed. As a result, a color image is formed on the light-sensitive material.

In the image-forming method of the invention (including the first and second embodiments), the image can be formed on an image-receiving material. The image-receiving material is described hereinbelow. The image forming method employing the image-receiving material or the image-receiving layer is described in Japanese Patent Provisional Publication No. 61(1986)-278149.

Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance (which hereinafter includes the diffusible dye of the second embodiment), the image-receiving material be composed of a simple support.

For example, when a color formation system using a color former and developer is employed, the developer can be conained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting powder from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer.

In the first embodiment, pressing the heat-developed light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

In the second embodiment, pressing the light-sensitive material on the image-receiving material to transfer the diffusible dye, a color image can be also produced on the image-receiving material.

The image-forming method can be used for monochromatic or color photography, printing, radiography, diagnosis (e.g., CRT photography of diagnostic device using supersonic wave), copy (e.g., computer-graphic hard copy), etc.

Examples of image-forming apparatus for carrying out the method of the present invention are illustrated hereinafter referring to the accompanying drawings.

FIG. 1 schematically shows an embodiment of the image-forming apparatus.

On the upper surface of a housing 1, there is provided a glass plate 2 for supporting an original. An optical exposure system 200 is provided under the glass plate 2. The exposure means 200 and a lower unit 3 are isolated from each other by a partition wall 224.

On the side part of the housing 1, there is detachably provided a cartridge 14 for a light-sensitive material, in which a light-sensitive material S is wound around a roll 12. The light-sensitive material S drawn out from the cartridge 14 is cut into a given length by a cutter unit 23. The light-sensitive material is irradiated with light from an optical axis 226 in an exposure zone 30 and is thus imagewise exposed.

The light-sensitive material S which has been imagewise exposed in the exposure part 30 is heat-developed in a heat-development device 40 and placed upon an image-receiving material (paper) C fed from an image receiving material feeder 72 by means of a superposing device 70. A pressure of about 500 kg/cm² is applied to the laminate by a pressure transfer device 80.

After pressing the light-sensitive material on the image-receiving material, the light-sensitive material S is peeled off from the image-receiving material C by a peeling device 90 and fed to a light-sensitive material discarding part 104 to discard it. The image-receiving material C is fixed by a fixing device 106 and delivered to a take-up tray 130.

In the heat-development device 40, the light sensitive material S is conveyed from the exposure zone 30 along guide plates 56 and 57. In this embodiment, at least one of the guide plates 56 and 57 serves as a preheating plate to remove water from the base paper sheet of the light-sensitive material S. The resulting light-sensitive material S is conveyed between the heating drum 41 and the endless belt 47. The endless belt 47 is stretched along the heating drum 41 and rollers 42, 43, 44 and 45 and traveled around them. Thus, the light-sensitive material S can be conveyed surely without generating water vapor and causing shrinkage and wrinkling during heat-development. Further, the light-sensitive material S can be heat-developed without being affected by water (moisture). After the development, the light-sensitive material S is conveyed along a guide plate 52 to a superposing plate 70 where the material S and the image receiving paper C are superposed on each other.

Figure 2:
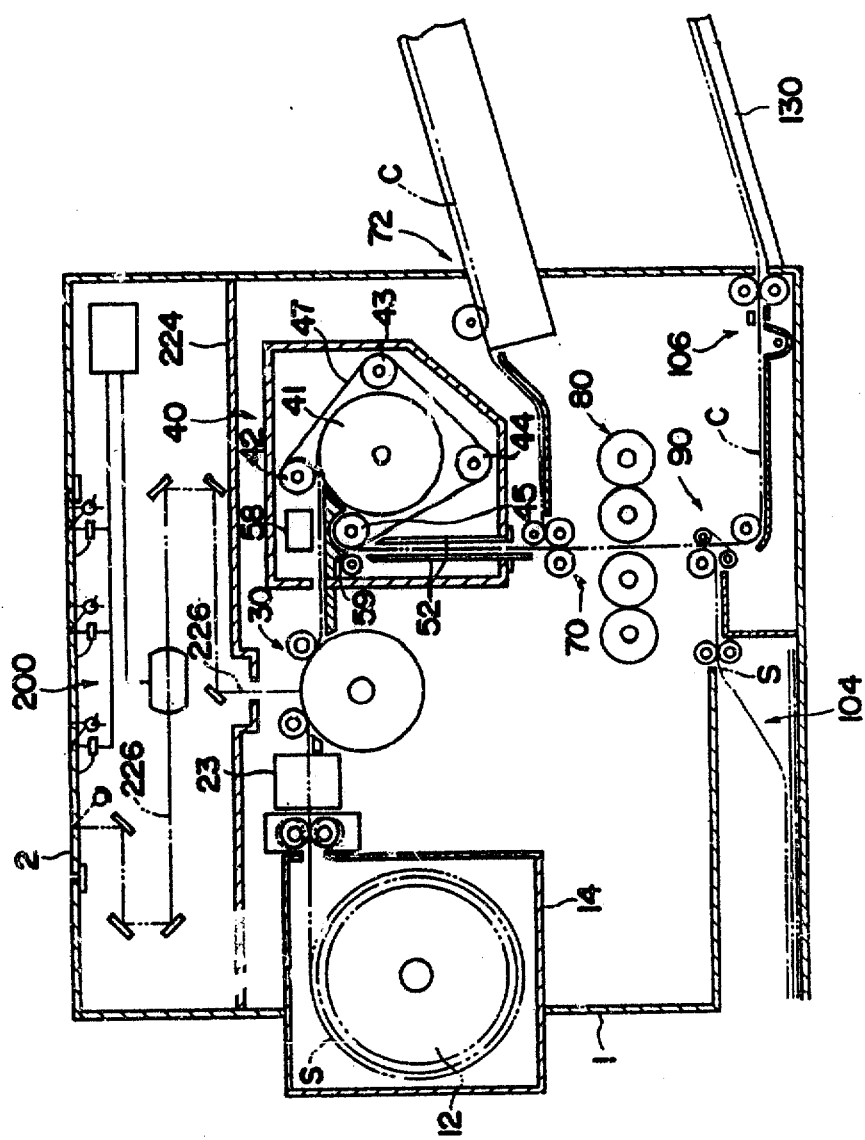
FIG. 2 schematically shows another embodiment of an image recording apparatus suitably employable in carrying out the method of the present invention.

FIG. 2 schematically shows another embodiment of the image-forming apparatus. In the heat-development device 40, the light-sensitive material S conveyed from the exposure zone 30 is heated on a guide plate 59 by hot air from a hot air generating device 58 to remove water from the base paper sheet. Thus, the heat-development of the light-sensitive material S can be carried out in a similar manner to that in the heat-development device 40 of FIG. 1.

Figure 3:
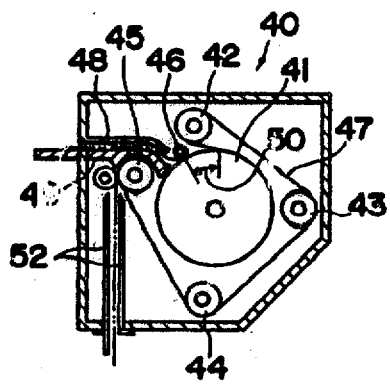
FIGS. 3, 4 and 5 are schematic views illustrating other embodiments of the heat-development device of the image recording apparatus.

FIG. 3 shows a cross-sectional view of a heat-development device 40 which is used in still other embodiment of the image-forming apparatus. The contact surface of the light-sensitive material S with the heating drum 41 is heated in preheating zone 50 on the heating drum 41 until the light-sensitive material S is conveyed between the heating drum 41 and an endless belt 47. The back of the light-sensitive material S is opened to the air in the heat-development device 40 so that water is removed from the base paper sheet. Heat development is then carried out in similar manner to that described above.

Figure 4:
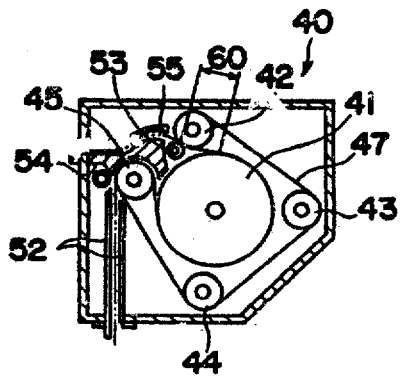

FIG. 4 shows a cross-sectional view of a heat-development device 40 which is used in further other embodiment of the image-forming apparatus. The light-sensitive material S fed from the exposure zone 30 is guided by guide plate 54 and 55, put between the endless belt 47 and a roller 53 and conveyed. When at least one of the rollers 42 and 53 is used as a heating roller, the light-sensitive material is preheated to remove water from the base paper sheet before the light-sensitive material S reaches the heating drum S. Heat development is then carried out in similar manner to that described above.

Among these embodiments of the image-forming apparatus, those shown in FIGS. 1, 2 and 4 are preferred, in which the heating device for removing water is independent of that for heat-development.

In an embodiment, the light-sensitive layer contains at least silver halide, a reducing agent and a polymerizable compound. In another embodiment, the light-sensitive layer contains at least silver halide and a dye providing substance. Each of the components is described below.

There is not specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the other shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain hving a core/shell structure in which the silver iodide content in the shell is higher than that in the core can be also employed.

There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-{[(2-N-butyl-N-octylsulfamoyl)-4-methanesulfonyl]phenyl]hydrazine, 1-{4-(2,5-di-tert-pentylphenox butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl} phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the image-forming method of the invention, a polymerizable compounds having a relatively higher boiling point (e.g., 80° C. or higher) is prebarably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxvalkylenated bisphenol A.

The polymerizable compounds can be used singly or in combination of two or more compounds. For example, a mixture of two or more polymerizable componds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

In another embodiments of the light-sensitive material, a dye providing substance is used in place of the reducing agent and polymerizable compound. However, the reducing agent may be optionally contained in the light-sensitive layer in this embodiment.

Preferred dye providing substances which can be employed in the image-forming method can be represented by the following formula (I):

$$(Dye-X)_q-Y \qquad (I)$$

wherein Dye represents a dye which becomes mobile when it is released from the molecule of the compound represented by the formula (I); X represents a simple bond or a connecting group; Y represents a group which releases Dye in correspondence or countercorrespondence to light-sensitive silver salts having a latent image distributed imagewise, the diffusibility of Dye released being different from that of the compound represented by formula (I) and q represents an integer of 1 or 2.

The dye represented by Dye is preferably a dye having a hydrophilic group. Examples of the dye which can be used include azo dyes, azomethine dyes, anthraquinone dyes, naphthoquinone dyes, styryl dyes, nitro dyes, quinoline dyes, carbonyl dyes and phthalocyanine dyes, etc. These dyes can also be used in the form of having temporarily shorter wavelengths, the color of which is recoverable in the development processing.

More specifically, the dyes as described in U.S. Pat. No. 4,500,626 can be utilized.

Examples of the connecting group represented by X include —NR-- (wherein R represents a hydrogen atom, an alkyl group, or a substituted alkyl group), —SO$_2$—, —CO—, an alkylene group, a substituted alkylene group, a phenylene group, a substituted phenylene group, a naphthylene group, a substituted naphthylene group, —O—, —SO—, or a group derived by combining together two or more of the foregoing groups.

In the following, preferred embodiments of Y in the formula (I) are described in greater detail.

In one embodiment, Y is selected so that the compound represented by the general formula (I) is an image forming nondiffusible compound which is oxidized as a result of development, thereby undergoing self-cleavage and releasing a diffusible dye.

An example of Y which is effective for compounds of this type is an N-substituted sulfamoyl group. For example, a group represented by formula (II) is illustrated for Y.

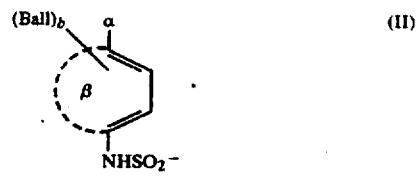

wherein

β represents non-metallic atoms necessary for forming a benzene ring, which may optionally be fused with a carbon ring or a hetero ring to form, for example, a naphthalene ring, a quinoline ring, a 5,6,7,8-tetrahydronaphthalene, a chroman ring or the like.

α represents a group of —OG$^{11}$ or —NHG$^{12}$ (wherein G$^{11}$ represents hydrogen or a group which forms a hydroxy group upon being hydrolyzed, and G$^{12}$ represents hydrogen, an alkyl group containing 1 or 22 carbon atoms or a hydrolyzable group).

Ball represents a ballast group, and b represents an integer of 0, 1 or 2.

Specific examples of this type of Y are described in Japanese Patent Provisional Publication Nos. 48(1973)-33826 and 53(1978)-50736.

Other examples of Y suited for this type of compound are those represented by the following formula (III):

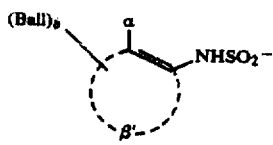

(III)

wherein Ball, α, and b are the same as defined with (II), β' represents atoms necessary for forming a carbon ring (e.g., a benzene ring which may be fused with another carbon ring or a hetero ring to form a naphthalene ring, quinoline ring, 5,6,7,8-tetrahydronaphthalene ring, chroman ring or the like. Specific examples of this type of Y are described in Japanese Patent Provisional Publication Nos. 51(1976)-11324, 56(1981)-12642, 57(1982)-4043 and 57(1982)-650 and U.S. Pat. No. 4,053,312.

Further examples of Y suited for this type of compound are those represented by the following formula (IV):

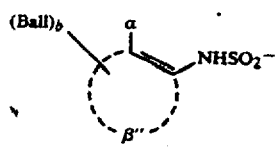

(IV)

wherein Ball, α and b are the same as defined with the formula (II), and β" represents atoms necessary for forming a hetero ring such as a pyrazole ring, a pyridine ring or the like, said hetero ring being optionally bound to a carbon ring or a hetero ring. Specific examples of this type of Y are described in Japanese Patent Provisional Publication No. 51(1976)-104343.

Still further examples of Y suited for this type of compound are those represented by the following formula (V):

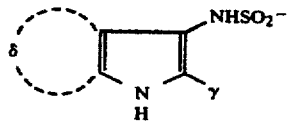

(V)

wherein γ preferably represent hydrogen, a substituted or unsubstituted alkyl, aryl or heterocyclic group, or —CO—G$^{21}$; G$^{21}$ represents —OG$^{22}$, —SG$^{22}$ or —NG$^{23}$G$^{24}$ (wherein G$^{22}$ represents hydrogen, an alkyl group, a cycloalkyl group or an aryl group, G$^{23}$ is the same as defined for said G$^{22}$, or G$^{23}$ represents an acyl group derived from an aliphatic or aromatic carboxylic or sulfonic acid, and G$^{24}$ represents hydrogen or an unsubstituted or substituted alkyl group); and δ represents a residue necessary for completing a fused benzene ring, Specific examples of this type of Y are described in Japanese Patent Provisional Publication Nos. 51(1976)-104343, 53(1978)-4730, 54(1979)-130122 and 57(1982-38055.

Still further examples of Y suited for this type of compound are those represented by the formula (VI):

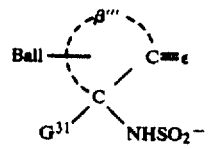

(VI)

where Ball is the same as defined with the formula (II); ε represents an oxygen atom or =NG$^{32}$ (wherein G$^{32}$ represents hydroxyl or an optionally substituted amino group) (examples of H$_2$N—G$^{32}$ to be used for forming the group of =NG$^{32}$ including hydroxylamine, hydrazines, semicarbazides, thiosemicarbazides, etc.); β''' represents a saturated or unsaturated nonaromatic 5-, 6- or 7-membered hydrocarbon ring; and G$^{31}$ represents hydrogen or a halogen atom (e.g., a fluorine atom, a chlorine atom, a bromine atom, etc.).

Specific examples of this type of Y are described in Japanese Patent Provisional Publication Nos. 53(1978)-3819 and 54(1979)-48534.

Other examples of Y of this type of compound are described in Japanese Patent Publication Nos. 48(1973)-32129, 48(1973)-39165, Japanese Patent Provisional Publication No. 49(1974)-64436 and U.S. Pat. No. 3,443,934, etc.

Still further examples of Y are those represented by the following formula (VII):

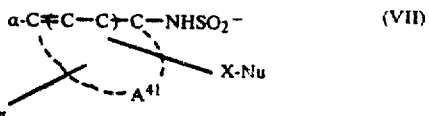

(VII)

where α represents OR$^{41}$ or NHR$^{42}$; R$^{41}$ represents hydrogen or a hydrolyzable component; R$^{42}$ represents hydrogen or an alkyl group containing 1 to 50 carbon atoms; A$^{41}$ represents atoms necessary for forming an aromatic ring; Ball represents an organic immobile group existing on the aromatic ring, with Ball's being the same or different from each other; m represents an integer of 1 or 2; X represents a divalent organic group having 1 to 8 atoms, with the nucleophilic group (Nu) and an electrophilic center (asterisked carbon atom) formed by oxidation forming a 5- to 12-membered ring; Nu represents a nucleophilic group; n represents an integer of 1 or 2; and α may be the same as defined with the above-described formula (II). Specific examples of this type of Y are described in Japanese Patent Provisional Publication No. 57(1982)-20735.

In another embodiment, Y is selected so that the compound represented by the formula (I) is an image forming nondiffusible compound which releases a diffusible dye in the presence of a base as a result of self cyliczation or the like but which, when reacted with an oxidation product of a developing agent, substantially never releases the dye.

Examples of Y effective for this type of compound are those which are represented by the formula (VIII):

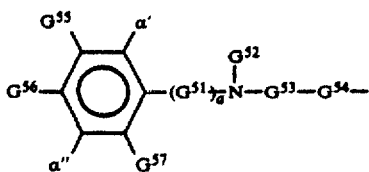

(VIII)

wherein

α' represents an oxidizable nucleophilic group (e.g., a hydroxy group, a primary or secondary amino group, a hydroxyamino, a sulfonamido group or the like) or a precursor thereof;

α" represents a dialkylamino group or an optional group defined for α;

$G^{51}$ represents an alkylene group having 1 to 3 carbon atoms;

a represents 0 or 1;

$G^{52}$ represents a substituted or unsubstituted alkyl group having 1 to 40 carbon atoms or a substituted or unsubstituted aryl group having 6 to 40 carbon atoms;

$G^{53}$ represents an electrophilic group such as —CO— or —CS—;

$G^{54}$ represents an oxygen atom, a sulfur atom, a selenium atom, nitrogen atom or the like and when $G^{54}$ represents a nitrogen atom, it has hydrogen or may be substituted by an alkyl or substituted alkyl group having 1 to 10 carbon atoms or an aromatic residue having 6 to 20 carbon atoms; and $G^{55}$, $G^{56}$ and $G^{57}$ each represents hydrogen, a halogen atom, a carbonyl group, a sulfamyl group, a sulfonamido group, an alkyloxy group having 1 to 40 carbon atoms or an optional group defined for $G^{52}$, $G^{55}$ and $G^{56}$ may form a 5- to 7-membered ring, and $G^{56}$ may represent

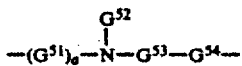

with the proviso that at least one of $G^{52}$, $G^{55}$, $G^{56}$ and $G^{57}$ represents a ballast group. Specific examples of this type of Y are described in Japanese Patent Provisional Publication No. 51(1976)-63618.

Further examples of Y suited for this type of compound are those which are represented by the following formulae (IX) and (X):

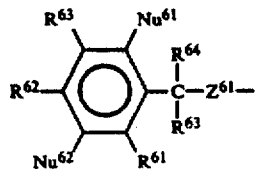

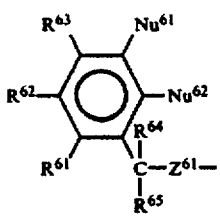

wherein $Nu^{61}$ and $Nu^{62}$ which may be the same or different, each represents a nucleophilic group or a precursor thereof; $Z^{61}$ represents a divalent atom group which is electrically negative with respect to the carbon atom substituted by $R^{64}$ and $R^{65}$; $R^{61}$, $R^{62}$ and $R^{63}$ each represents hydrogen, a halogen atom, an alkyl group, an alkoxy group or an acylamino group or, when located at adjacent positions on the ring, $R^{61}$ and $R^{62}$ may form a fused ring together with the rest of the molecule, or $R^{62}$ and $R^{63}$ may form a fused ring together with the rest of the molecule; $R^{64}$ and $R^{65}$, which may be the same or different, each represents hydrogen, a hydrocarbon group or a substituted hydrocarbon group; with at least one of the substituents, $R^{61}$, $R^{62}$, $R^{63}$, $R^{64}$ and $R^{65}$ having a ballast group, Ball, of an enough size so as to render the above-described compounds immobile. Specific examples of this type of Y are described in Japanese Patent Provisional Publication Nos. 53(1978)-69033 and 54(1979)-130927.

Further examples of Y suited for this type of compound are those which are represented by the formula of (XI):

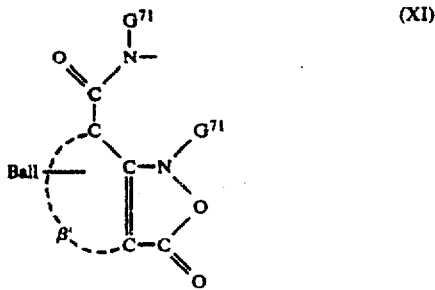

wherein

Ball and β' are the same as defined for those in formula (III), and $G^{71}$ represents an alkyl group (including a substituted alkyl group). Specific examples of this type of Y are described in Japanese Patent Provisional Publication Nos. 49(1974)-111628 and 52-(1977)-4819.

In still another embodiment, Y is selected so that the compound represented by the general formula (I) is an image forming, nondiffusible compound which itself does not release any dye but, upon reaction with a reducing agent releases a dye. With those compounds, compounds which mediate the redox reaction (called electron donors) are preferably used in combination.

Examples of Y effective for this type of compound are those represented by the formula (XII):

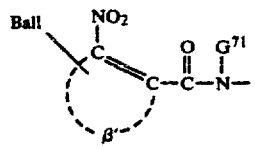

wherein Ball and β' are the same as defined for those in the formula (III), and $G^{71}$ represents an alkyl group (including a substituted alkyl group). Specific examples of this type of Y are described in Japanese Patent Provisional Publication Nos. 35533/78 and 110827/78.

Further examples of Y suited for this type of compound are those which are represented by (XIII):

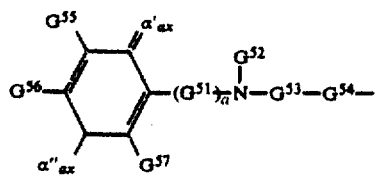

(XIII)

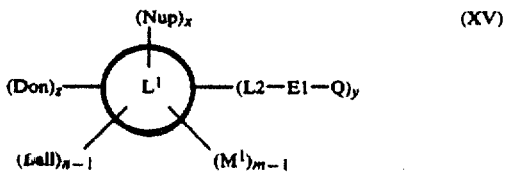

(XV)

wherein $\alpha'_{ax}$ and $\alpha''_{ax}$ represent groups capable of giving $\alpha'$ and $\alpha''$, respectively, upon reduction, and $\alpha'$, $\alpha''$, $G^{51}$, $G^{52}$, $G^{53}$, $G^{54}$, $G^{56}$, $G^{57}$ and a are the same as defined with respect to formula (VIII). Specific examples of Y described above are described in Japanese Patent Provisional Publication No. 53(1978)-110872 and U.S. Pat. Nos. 4,356,249 and 4,358,525.

Further examples of Y suited for this type of compound are those which are represented by the formulae (XIVA) and (XIVB):

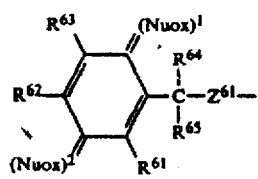

(XIVA)

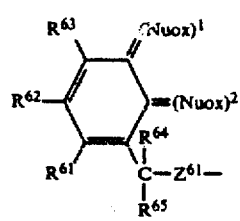

(XIVB)

wherein (Nuox)$^1$ and (Nuox)$^2$, which may be the same or different, each represents an oxidized nucleophillic group, and other notations are the same as defined with respect to the formulae (IX) and (X). Specific examples of this type of Y are described in Japanese Patent Provisional Publication Nos. 54(1979)-130927 and 56(1981)-164342.

The publicly known documents having been referred to with respect to (XII), (XIII), (XIVA) and (XIVB) describe electron donors to be used in combination.

In a further embodiment, Y is selected so that the compound represented by the general formula (I) is a LDA compound (Linked Donor Acceptor Compounds). The compound is an image forming nondiffusible compound which causes donor-acceptor reaction in the presence of a base to release a diffusible dye but, upon reaction which an oxidation product of a developing agent, it substantially does not release the dye any more.

Examples of Y effective for this type of compound are those represented by the formula of (XV) (specific examples thereof being described in Japanese Patent Provisional Publication No. 58(1983)-60289):

wherein n, x, y and z each represents 1 or 2, m represents an integer of 1 or more; Don represents a group containing an electron donor or its precursor moiety; L$^1$ represents an organic group linking Nup to —EL—Q or Don; Nup represents a precursor of a nucleophilic group; El represents an electrophilic center; Q represents a divalent group; Ball represents a ballast group; L$^2$ represents a linking group; and M$^1$ represents an optional substituent.

The ballast group is an organic ballast group which can render the dye image forming compound nondiffusible, and is preferably a group containing a $C_{8-32}$ hydrophobic group. Such organic ballast group is bound to the dye image forming compound directly or through a linking group (e.g., an imino bond, an ether bond, a thioether bond, a carbonamido bond, a sulfonamido bond, an ureido bond, an ester bond, an imido bond, a carbamoyl bond, a sulfamoyl bond, etc., and combination thereof).

Two or more kinds of the dye providing substances can be employed together. In such a case two or more kinds of the dye providing substances may be used together in order to provide the same hue or in order to reproduce black color.

Various embodiments of the light-sensitive materials, optional components which may be contained in the light-sensitive layer, and auxiliary layers which may be optionally arranged on the light-sensitive materials are described below.

In the embodiment employing a polymerizable compound, The polymerizable compound is preferably dispersed in the form of oil droplets in the light-sensitive layer. Other components in the light-sensitive layer, such as silver halide, the reducing agent, the color image forming substances may be also contained in the oil droplets.

In the case that silver halide grains are contained in the oil droplets, the oil droplets containing five or more silver halide grains are preferably more than 50% by weight.

The oil droplets of the polymerizable compound are preferably prepared in the form of microcapsules. There is no specific limitation on preparation of the microcapsules.

There is also no specific limitation of shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm.

In the case that silver halide grains are contained in the microcapsule, the silver halide grains aare preferably arranged in the shell material of the microcapsules.

Further, two or more kinds of the microcapsules differing from each other with respect to at least one of the silver halide, the polymerizable compound and the color image forming substance can be employed. Furthermore, three or more kinds of the microcapsules differing from each other with respect to the color image forming substance is preferably employed to form a full color image.

In another embodiment employing a dye providing substance, the light-sensitive material preferably has a multi-layer structure to form a full color image in place of employing oil droplets or microcapsules.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator and solvent of the polymerizable compound.

There is no specific limitation with respect to the color image forming substance, and various kinds of substances can be employed. Thus, examples of the color image forming substance include both colored substance (i.e., dyes and pigments) and non-colored or almost non-colored substance (i.e., color fomer or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", pp. 26–32 (June 19, 1980).

In the case that the color image forming substance comprising two components (e.g., a color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxyalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methylsulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, reducing agent and polymerizable compound are preferably contained in a microcapsule and the base or base precursor is preferably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, orr under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be use singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Example of preparation of the light-sensitive material wherein the light-sensitive layer contains at least silver halide, a reducing agent and a polymerizable compound is described below.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium cloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerization compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyle cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion. The other components can be added to the coating solution in a similar manner as the emulsion of the polymerizable compound.

A light-sensitive material can be prepared by coating and drying the above-prepared coating solution on a support in the conventional manner.

The present invention is further described by the following examples without limiting the invention.

EXAMPLE 1

Preparation of silver halide emulsion

In 1,000 ml of water were dissolved 70 g of gelatin and 0.5 g of potassium bromide, and the resulting gelatin solution was adjusted to pH 3.8 using 1N sulfuric acid and kept at 70° C. To the gelatin solution, 600 ml of an aqueous solution containing 70 g of potassium bromide and 600 ml of an aqueous solution containing 0.59 mole of silver nitrate were added simultaneously at the same feed rate over a period of 50 minutes. After 5 minutes, to the gelatin solution, 100 ml of an aqueous solution containing 3.9 g of potassium iodide and 100 ml of an aqueous solution containing 0.024 mole of silver nitrate were added simultaneously at the same feed rate over a period of 5 minutes to obtain a silver iodobromide emulsion having tetradecahedral grain, uniform grain size distribution and mean grain size of 0.25 μm.

The emulsion was washed for desalting, and then to the emulsion was added 82 ml of 1% methanol solution of the following sensitizing dye. Yield of the emulsion was 600 g.

(Sensitizing dye)

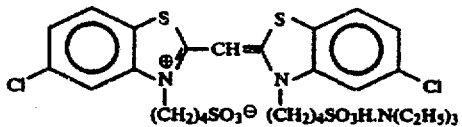

Preparation of light-sensitive composition

In 100 g of trimethylolpropane triacrylate were dissolved 0.1 g of the following copolymer, 13 g of the following color image forming substance and 0.5 g of Emulex NP-8 (tradename of Nippon Emulsion Co., Ltd.).

(Copolymer)

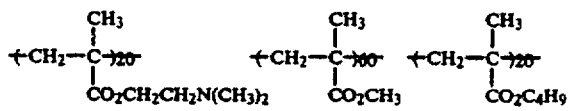

(Color image forming substance)

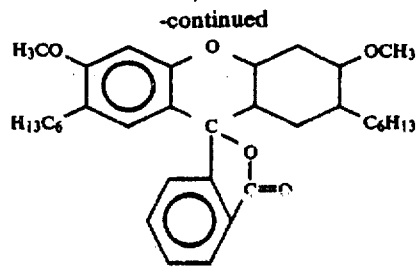

In 18 g of the solution was dissolved 1.3 g of the following reducing agent (I) and 1.3 g of the following reducing agent (II).

(Reducing agent (I))

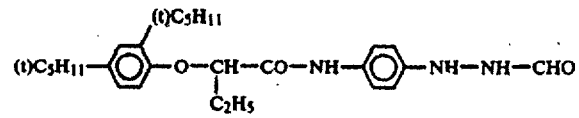

(Reducing agent (II))

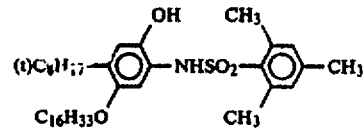

To the resulting solution was added 2.0 g of the silver halide emulsion, and the mixture was stirred at 15,000 r.p.m. for 10 minutes to obtain a light-sensitive composition.

Preparation of light-sensitive microcapsule

To 9.0 g of 20% aqueous solution of Isobam (tradename of Kuraray Co., Ltd.) was added 50 g of 2.5% aqueous solution of pectin. After the solution was adjusted to a pH of 4.0 using 10% sulfuric acid, the light-sensitive composition was added to the resulting solution, and the mixture was stirred at 12,000 r.p.m. for 5 minutes to emulsify the light-sensitive composition in the aqueous medium.

To 72.5 g of the aqueous emulsion were added 8.0 g of 40% aqueous solution of urea, 3.0 g of 10% aqueous solution of resorcinol, 8.0 g of 37% aqueous solution of formaldehyde and 3.00 g of 8% aqueous solution of ammonium sulfate in this order, and the mixture was heated at 60° C. for 2 hours while stirring. After the mixture was adjusted to a pH of 6.5 using 10% aqueous solution of sodium hydroxide, 4.0 g of 30% aqueous solution of sodium hydrogen sulfite was added to the mixture to obtain a dispersion containing light-sensitive microcapsules.

Preparation of paper support

In a disk refiner, 70 parts of laubholz bleached kraft pulp (LBKP) and 30 parts of nadelholz bleached kraft pulp (NBKP) were beated to obtain a pulp having a Canadian standard freeness of 350 cc. To the resulting pulp were added 5.0 parts of talc, 1.5 parts of rosin, 2.0 parts of aluminium sulfate and 0.5 part of polyamidepolyamine-epichlorohydrin to obtain a paper stuff, in which each part was a dry weight ratio to the pulp. A base paper sheet having basis weight of 40 g/m² and thickness of 50 μm was made from the obtained paper stuff in a Fourdrinier paper machine.

On the base paper sheet was coated a mixture of 100 parts of SBR (i.e., styrene-butadiene rubber) latex, 500 parts of clay and 2 parts of sodium salt of 2,4-dichloro-6-hydroxy-S-triazine to give a layer having a weight of 15 g/m². Thus, a paper support was obtained.

The Cobb's water absorptiveness on the surface of the coating layer of the paper support was 10 g/m².

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=80/20 as volume ratio) of guanidine trichroloacetate to prepare a coating solution.

(Anionic surfactant)

The coating solution was uniformly coated on the surface of the coating layer of the paper support to give a layer having a wet thickness of 40 μm and dried at about 40° C. to obtain a light-sensitive material.

Preparation of image-receiving material

To 125 g of water was added 11 g of 40% aqueous solution of sodium hexametaphosphate, and were further added 51 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 12 g of 50% latex of SBR (styrene-butadiene rubber) and 77 g of 8% aqueous solution of polyvinyl alcohol, and the resulting mixture was made uniform.

The mixture was then uniformly coated on a coated paper to give a layer having a wet thickness of 36 μm and dried to obtain an image-receiving material.

Image formation employing light-sensitive material

The prepared light-sensitive material was cut into pieces of A4 size and exposed to light all over the light-sensitive layer at quantity of light of 20 CMS in FUJI DICHROIC COLOR ENLARGER (tradename of Fuji Photo Film Co., Ltd.).

The light-sensitive material was placed in a thermostat (temperature: 25° C., relative humidity: 14%) to remove water from the base paper to the extent that the water content of the base paper is 1%. The water content was measured using an infrared water content meter (FD-220, produced by Kett Co., Ltd.)

Figure 5:
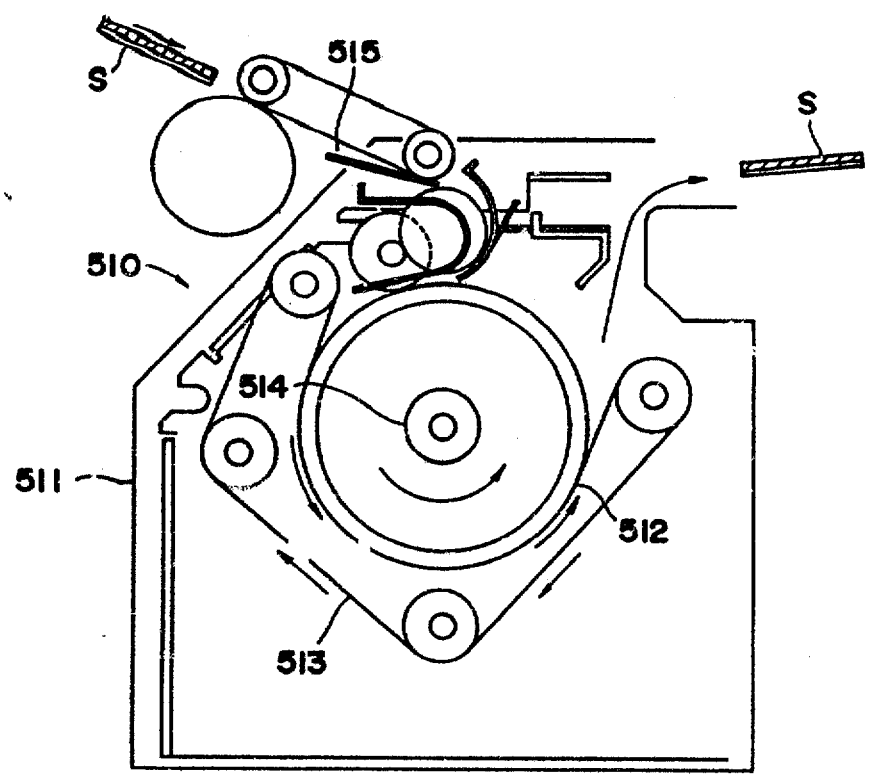

The light-sensitive material was then heated in a heat-development device shown in FIG. 5 at 140° C. for 20 seconds.

FIG. 5 shows a cross-sectional view of a heat-development device. The heat-development device 510 comprises a heat roller 512 and a conveyer belt 513 which are placed in a housing 511. The heat roller 512 has an inner space in which a halogen lamp 514 is placed. The halogen lamp functions as a heater to maintain the temperature on the surface of the roller. The conveyer belt 513 is a endless belt composed of a fluorine-contained rubber. The belt 513 rotates with the roller 512. The light-sensitive material S is conveyed between the roller 512 and the belt 513 where the material S is heat-developed. Therefore, the condition of the heat-development is determined by the temperature of the lamp 514 and the rotation rate of the belt 513.

The light-sensitive material S was inserted into an inlet 515 of the heat-development device 510 and then heat-developed in the device under the above-mentioned conditions.

The exposed and heated light-sensitive material was then combined with the image-receiving material and passed through press rolls at pressure of 500 kg/cm² to obtain a positive color image on the image receiving material.

Evaluation of Image formation

The positive color image formed on the image receiving material was evaluated with respect to the unevenness of the image and the uniformity of the density. The unevenness of the image was evaluated as following grades: A (scarcely observed) to D (remarkably observed). The uniformity of the density was evaluated as the difference between the maximum density (Dmax) and the minimum density (Dmin). The density was measured using Macbeth reflection densitometer.

EXAMPLE 2

Image was formed and evaluated in the same manner as in Example 1, except that the relative humidity of the thermostat was changed from 14% to 23%. Thus water was removed from the base paper to the extent that the water content of the base paper is 3%.

EXAMPLE 3

Image was formed and evaluated in the same manner as in Example 1, except that the relative humidity of the thermostat was changed from 14% to 42%. Thus water was removed from the base paper to the extent that the water content of the base paper is 4%.

COMPARISON EXAMPLE 1

Image was formed and evaluated in the same manner as in Example 1, except that the relative humidity of the thermostat was changed from 14% to 80%. Thus water was removed from the base paper to the extent that the water content of the base paper is 8%.

The results of Examples 1 to 3 and Comparison Example 1 are set forth in Table 1.

TABLE 1

| Image Formation | Unevenness of Image | Maximum Density | Minimum Density | Difference (Dmax-Dmin) |
|---|---|---|---|---|
| Example 1 | A | 0.55 | 0.52 | 0.03 |
| Example 2 | B | 0.57 | 0.50 | 0.07 |
| Example 3 | C | 1.00 | 0.45 | 0.55 |
| Comp. Ex. 1 | D | 1.40 | 0.25 | 1.15 |

It is apparent from the results in Table 1 that the image forming method of the invention gives a clear image in which the unevenness is remarkably reduced and the uniformity of the density is much improved.

EXAMPLE 4

Image was formed and evaluated in the same manner as in Example 1, except that the amount of clay used in the preparation of the paper support was changed from 500 parts to 300 parts and water was removed from the base paper to the extent that the water content of the base paper is 3%. The Cobb's water absorptiveness on the surface of the coating layer of the paper support was about 5 g/m².

EXAMPLE 5

Image was formed and evaluated in the same manner as in Example 1, except that the amount of clay used in the preparation of the paper support was changed from 500 parts to 200 parts and water was removed from the base paper to the extent that the water content of the base papler is 3%. The Cobb's water absorptiveness on the surface of the coating layer of the paper support was about 3 g/m².

COMPARISON EXAMPLE 2

Image was formed and evaluated in the same manner as in Example 1, except that the base paper sheet is per se used as the paper support and water was removed from the base paper to the extent that the water content of the base papler is 3%. The Cobb's water absorptiveness on the surface of the paper support was 30 g/m².

The results of Examples 4 & 5 and Comparison Example 2 are set forth in Table 2.

TABLE 2

| Image Formation | Unevenness of Image | Difference (Dmax-Dmin) |
|---|---|---|
| Example 4 | A | 0.05 |
| Example 5 | A | 0.02 |
| Comp. Ex. 2 | A | 0.80 |

It is apparent from the results in Table 1 that the image forming method of the invention gives a clear image in which the uniformity of the density is much improved.

EXAMPLE 6

Preparation of silver halide emulsion

In 3,000 ml of water were dissolved 40 g of gelatin and 26 g of potassium bromide, and the resulting gelatin solution was kept at 50° C. while stirring. To the gelatin solution was added 200 ml of an aqueous solution containing 34 g of silver nitrate. To the mixture was added 100 ml of an aqueous solution containing 3.3 g of potassium iodide to obtain a silver bromoiodide emulsion. After the emulsion was adjusted to a pH for sedimentation, excess salts were removed, and the emulsion was adjusted to a pH of 6.0. Yield of the emulsion was 400 g.

Preparation of gelatin dispersion of dye providing substance

To a mixture of 10 g of the following dye providing substance, 0.5 g sodium sulfonate of 2-ethyl-hexyl succinate (surfactant) and 20 g of tricresyl phosphate (TPC) was added 30 ml of ethyl acetate, and the mixture was heated at about 60° C. To the mixture was added 100 g of 10% gelatin solution, and the resulting mixture was stirred. The mixture was further finely dispersed in a homogenizer at 1,000r.p.m. for 10 minutes to obtain a gelatin dispersion of the dye providing substance.

(Dye providing substance)

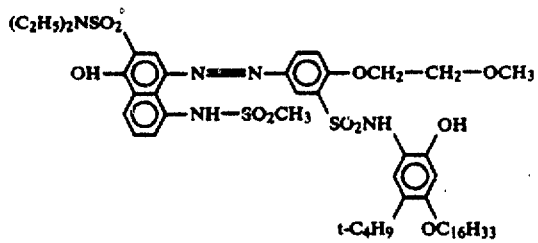

Preparation of light-sensitive material

To 25 g of the silver halide (bromoiodide) emulsion were added 25 g the gelatin dispersion of dye providing substance, 10 ml of 5% aqueous solution of the following compound (a), and 1.5 g of guanidine trichloroacetate. The mixture was heated to melt it. Thus a coating solution was prepared.

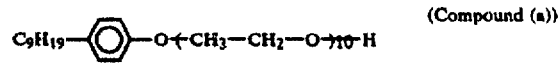

(Compound (a))

The coating solution was uniformly coated on the surface of the coating layer of the paper support used in Example 1 to give a light-sensitive layer having a wet thickness of 30 μm and dried.

To 25 g of 10% aqueous solution of gelatin was added 70 ml of water to prepare a coating solution of a protective layer. The coating solution was coated on the light-sensitive layer to give a protective layer having a wet thickness of 25 μm and dried to obtain a light-sensitive material.

Preparation of image-receiving material

To 160 ml of water were added 0.75 g of the following gelatin hardening agent (H-1), 0.25 g of the following gelatin hardening agent (H-2) and 100 g of 10% lime-processed gelatin. The mixture was uniformly dispersed and uniformly coated on a paper support (the base paper sheet is laminated with polyethylene in which titanium dioxide is dispersed) to give an undercoating layer having a wet thickness of 60 μm and dried.

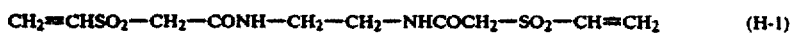 (H-1)

 (H-2)

In 200 ml of water was dissolved 15 g of the following polymer. To the solution was added 100 g of 10% lime-processed gelatin, and the mixture was made uniform. The resulting mixture was coated on the undercoating layer to give an image receiving layer having a wet thickness of 85 μm and dried to obtain an image receiving material (dye fixing material).

(Polymer)

-continued

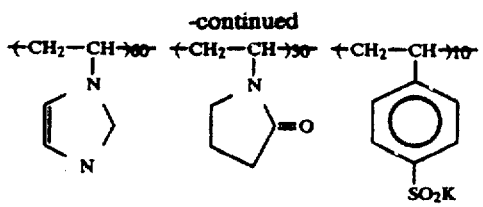

(Limiting viscosity: 0.3473 which is measured in 0.05 mole aqueous solution of sodium dihydrogenphosphate at 30° C.)

Image formation employing light-sensitive material

The prepared light-sensitive material was exposed to light and heat-developed in the same manner as in Example 1.

The exposed and heated light-sensitive material was then combined with the image-receiving material which had been wetted with water and then heated on a heat block at 80° C. for 6 seconds to obtain a magenta negative image on the image receiving material.

The obtained image was evaluated in the same manner as in Example 1.

EXAMPLE 7

Image was formed and evaluated in the same manner as in Example 6, except that the relative humidity of the thermostat was changed from 14% to 23%. Thus water was removed from the base paper to the extent that the water content of the base paper is 3%.

EXAMPLE 8

Image was formed and evaluated in the same manner as in Example 6, except that the relative humidity of the thermostat was changed from 14% to 42%. Thus water was removed from the base paper to the extent that the water content of the base paper is 4%.

COMPARISON EXAMPLE 3

Image was formed and evaluated in the same manner as in Example 6, except that the relative humidity of the thermostat was changed from 14% to 80%. Thus water was removed from the base paper to the extent that the water content of the base paper is 8%.

The results of Examples 6 to 8 and Comparison Example 3 are set forth in Table 3.

TABLE 3

| Image Formation | Water Content of Base Paper | Unevenness of Image | Difference (Dmax-Dmin) |
|---|---|---|---|
| Example 6 | 1% | A | 0.06 |
| Example 7 | 3% | B | 0.10 |
| Example 8 | 4% | C | 0.61 |
| Comp. Ex. 3 | 8% | D | 1.50 |

It is apparent from the results in Table 3 that the image forming method of the invention gives a clear image in which the unevenness is remarkably reduced and the uniformity of the density is much improved.

We claim:

1. An image-forming method comprising the steps of:
   (A) imagewise exposing a light-sensitive material comprising a light-sensitive layer containing silver halide, a reducing agent and a polymerizable compound provided on a paper support; and
   (B) simultaneously or thereafter, heat-developing the light-sensitive material to imagewise polymerize the polymerizable compound,
   wherein the paper support comprises a coating layer containing a hydrophobic polymer provided on a base paper sheet, the light-sensitive layer is provided on the coating layer, and the light-sensitive material is heat-developed after removal of water from the base paper sheet, and wherein a surface of said coating layer has a water absorptiveness of not more than 10 g/m$^2$, said water absorptiveness being a value measured according to the Cobb test method.

2. The image-forming method as claimed in claim 1, wherein the surface of the coating layer has a water absorptiveness of not more than 3 g/m$^3$, said water absorptiveness being a value measured according to the Cobb test method.

3. The image-forming method as claimed in claim 1, wherein the coating layer is provided on the base paper sheet in a coating amount of from 1 to 50 g/m$^2$.

4. The image-forming method as claimed in claim 1, wherein the water content of the base paper sheet is not more than 5%.

5. The image-forming method as claimed in claim 1, wherein water is removed from the base paper sheet after step (A).

6. The image-forming method as claimed in claim 1, wherein the light-sensitive material is heat-developed at a temperature of from 80° to 200° C.

7. The image-forming method as claimed in claim 1, wherein after step (B) is pressed on an image-receiving material to transfer an unpolymerized polymerizable compound to the image-receiving material.

8. The image-forming method as claimed in claim 1, wherein the light-sensitive layer further contains a color image forming substance.

9. An image-forming method comprising the steps of:
   (A) imagewise exposing a light-sensitive material comprising a light-sensitive layer containing silver halide and a dye providing substance provided on a paper support; and
   (B) simultaneously or thereafter, heat-developing the light-sensitive material to imagewise form or release a diffusible dye,
   wherein the paper support comprises a coating layer containing a hydrophobic polymer provided on a base paper sheet, the light-sensitive layer is provided on the coating layer, and the light-sensitive material is heat developed after removal of water from the base paper sheet, and wherein a surface of said coating layer has a water absorptiveness of not more than 10 g/m$^2$ said water absorptiveness being a value measured according to the Cobb test methd.

10. The image-forming method as claimed in claim 9, wherein the surface of the coating layer has a water absorptiveness of not more than 3 g/m$^2$, said water absorptiveness being a value measured according to the Cobb test method.

11. The image-forming method as claimed in claim 9, wherein the coating layer is provided on the base paper sheet in a coating amount of from 1 to 50 g/m$^2$.

12. The image-forming method as claimed in claim 9, wherein the water content of the base paper sheet is not more than 5%.

13. The image-forming method as claimed in claim 9, wherein water is removed from the base paper sheet after step (A).

14. The image-forming method as claimed in claim 9, wherein the light-sensitive material is heat-developed at a temperature of from 80° to 200° C.

15. The image-forming method as claimed in claim 9, wherein after step (B), the light-sensitive material is pressed on an image-receiving material to transfer the diffusible dye to the image-receiving material.

16. The image-forming method as claimed in claim 9, wherein the light-sensitive layer further contains a reducing agent.

* * * * *